(12) United States Patent
Foster, Sr. et al.

(10) Patent No.: US 8,286,044 B2
(45) Date of Patent: Oct. 9, 2012

(54) DYNAMIC RANDOM ACCESS MEMORY HAVING INTERNAL BUILT-IN SELF-TEST WITH INITIALIZATION

(75) Inventors: Jim G. Foster, Sr., Morrisville, NC (US); Sumeet Kochar, Apex, NC (US); Suzanne M. Michelich, III, Waukesha, WI (US); Jacques B. Taylor, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 12/559,870

(22) Filed: Sep. 15, 2009

(65) Prior Publication Data

US 2011/0066903 A1    Mar. 17, 2011

(51) Int. Cl.
*G01R 31/28* (2006.01)
*G11C 29/00* (2006.01)

(52) U.S. Cl. .......................... 714/733; 714/734; 714/718

(58) Field of Classification Search .................. 714/733, 714/734, 30, 718, 704, 736, 752, 769; 365/200, 365/201; 716/4; 702/117
See application file for complete search history.

(56) References Cited

U.S. PATENT DOCUMENTS

| | | | |
|---|---|---|---|
| 4,558,447 A | 12/1985 | Freeman et al. | |
| 5,748,640 A | 5/1998 | Jiang et al. | |
| 6,108,798 A * | 8/2000 | Heidel et al. | 714/30 |
| 6,185,712 B1 | 2/2001 | Kirihata et al. | |
| 6,230,290 B1 * | 5/2001 | Heidel et al. | 714/718 |
| 6,249,889 B1 * | 6/2001 | Rajsuman et al. | 714/718 |
| 6,367,042 B1 | 4/2002 | Phan et al. | |
| 6,452,848 B1 | 9/2002 | Obremski et al. | |
| 6,499,120 B1 | 12/2002 | Sommer | |
| 6,643,807 B1 | 11/2003 | Heaslip et al. | |
| 6,728,910 B1 | 4/2004 | Huang | |
| 7,251,757 B2 | 7/2007 | Ouellette et al. | |
| 7,313,739 B2 | 12/2007 | Menon et al. | |
| 7,458,000 B2 | 11/2008 | Gorman et al. | |
| 7,536,267 B2 * | 5/2009 | Zimmerman et al. | 702/117 |
| 2005/0120284 A1 | 6/2005 | Ouellette et al. | |
| 2005/0160310 A1 | 7/2005 | Ellis et al. | |
| 2007/0124628 A1 | 5/2007 | Price et al. | |
| 2007/0291560 A1 | 12/2007 | Hsieh et al. | |

OTHER PUBLICATIONS

Nelson, Erik et al "Test and Repair of Large Embedded DRAMS: part 2." ITC International Test Conference 2001, Paper 7.2, pp. 173-181.

* cited by examiner

*Primary Examiner* — Phung M Chung
(74) *Attorney, Agent, or Firm* — Thomas Tyson; Jeffrey L. Streets

(57) ABSTRACT

A method for self-contained testing within a DRAM comprises the DRAM receiving an instruction from an external processor to test a memory core on the DRAM, and the DRAM self-testing the memory core with one or more BIST pattern stored in a multipurpose register on the DRAM. Optionally, the step of self-testing may include writing the BIST pattern into all locations of the memory core, reading each location of the memory core, and comparing the content read from each location of the memory core with the BIST pattern, wherein a negative comparison indicates a failure has occurred. In a further option, the method may further comprise, after testing the DRAM, initializing the DRAM with an INIT pattern stored in the multipurpose register on the DRAM.

28 Claims, 2 Drawing Sheets

DYNAMIC RANDOM ACCESS MEMORY HAVING INTERNAL BUILT-IN SELF-TEST WITH INITIALIZATION

BACKGROUND OF THE INVENTION

1. Field of the Invention

The present invention relates to testing and initializing dynamic random access memory.

2. Background of the Related Art

Computer systems typically include a processor, memory, and a memory controller that receives requests from the processor to read information from memory and to write other information into the memory. The memory is often provided in one or more memory units, such as a dual inline memory module (DIMM). However, reading data from memory or writing data to memory requires a series of read or write operations accompanied by transmission of the data to or from the processor over a bus. Thus the speed and bandwidth of the communications between the processor and the memory become a significant limitation when large amounts of data must be read from memory or written into memory.

During startup of a computer system, all memory locations are checked for errors, such as a memory bit that is stuck high, stuck low, reads high when it should be low, or read low when it should be high. This test of the memory may be referred to as a built-in-self test (BIST), in which the processor loads all memory locations with a pattern, then reads each memory location and compared the data read to the known good pattern that was previously written into that memory location. This process may be repeated one or more times using different patterns in order to detect other errors. Although this process has been proven to be effective at identifying errors in the memory, the ever-increasing amount of memory available in computer systems requires ever-increasing number of transmissions between the processor and the memory. Accordingly, the large number of transmissions necessary to complete the test results in significant generation of heat and consumes a significant amount of time.

BRIEF SUMMARY OF THE INVENTION

One embodiment of the present invention provides a method for self-contained testing within a DRAM comprising the DRAM receiving an instruction from an external processor to test a memory core on the DRAM, and the DRAM self-testing the memory core with one or more BIST pattern stored in a multipurpose register on the DRAM. Optionally, the step of self-testing may include writing the BIST pattern into all locations of the memory core, reading each location of the memory core, and comparing the content read from each location of the memory core with the BIST pattern, wherein a negative comparison indicates a failure has occurred. In a further option, the method may further comprise, after testing the DRAM, initializing the DRAM with an INIT pattern stored in the multipurpose register on the DRAM.

Another embodiment of the invention provides a method for self-contained testing of the DRAM in a DIMM. The method comprises a plurality of DRAM in the DIMM receiving an instruction from an external processor to start testing a memory core within the DRAM, and each DRAM in the DIMM self-testing the memory core within the DRAM using a BIST pattern stored in a multipurpose register on the DRAM, wherein the plurality of DRAM are self-tested at the same time. Optionally, after testing each DRAM, the method may further comprises initializing each DRAM with an INIT pattern, such as an INIT pattern stored in the multipurpose register on the DRAM. In a further option, each DRAM may receive an instruction from the external processor that identifies one of a plurality of INIT patterns stored in the multipurpose register as the INIT pattern to be used in the self-test.

DETAILED DESCRIPTION OF THE INVENTION

Figure 1:
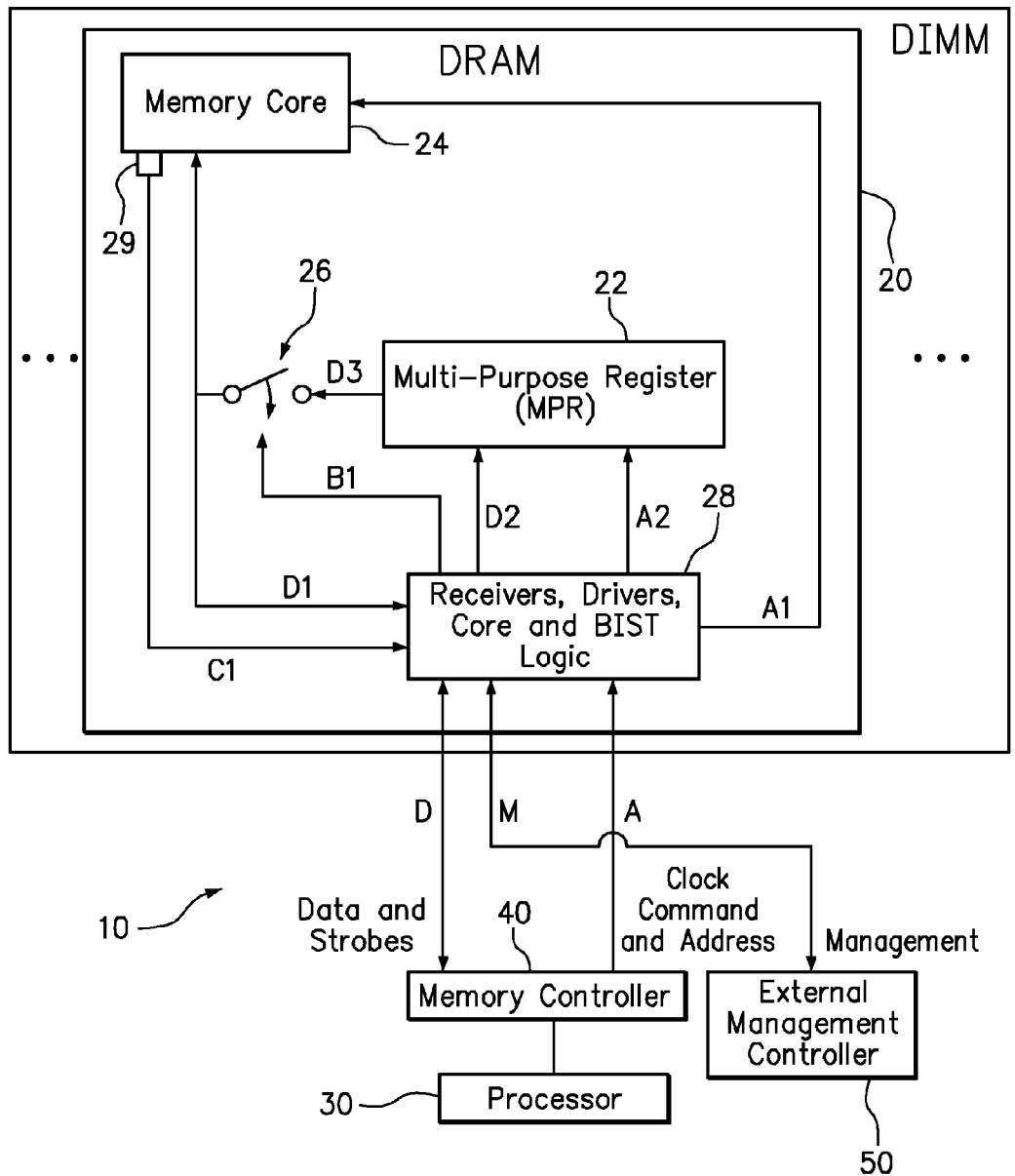
FIG. 1 is a schematic diagram of certain components on a computer system including a DRAM.

One embodiment of the present invention provides a method for self-contained testing within a DRAM comprising the DRAM receiving an instruction from an external processor to test a memory core on the DRAM, and the DRAM self-testing the memory core with one or more BIST pattern stored in a multipurpose register on the DRAM. Optionally, the step of self-testing may include writing the BIST pattern into all locations of the memory core, reading each location of the memory core, and comparing the content read from each location of the memory core with the BIST pattern, wherein a negative comparison indicates a failure has occurred.

In another embodiment, the method may further comprise, after testing the DRAM, initializing the DRAM with an INIT pattern stored in the multipurpose register on the DRAM. Preferably the step of initializing the DRAM automatically follows completion of the DRAM testing. The INIT pattern may be a known good pattern with valid ECC check bits, or the self-test may end with a final BIST pattern including valid ECC check bits and serving as a valid INIT pattern to initialize the DRAM. Finally, the method may optionally include setting a completion flag and a completion status in response to completing the BIST and INIT routines. Such a completion flag and status may be read by the processor following passage of a sufficient time period for the self-test to be completed.

In a further embodiment, the method may further comprise counting the number of failures detected during testing, or storing the location and type of failures detected during testing, or some combination thereof. Each failure may be identified as an "always high" failure, an "always low" failure, a "high read low" failure, or a "low read high" failure. Again, some or all of the failure data may be read by the processor after completion of the self-test, as indicated by an alert signal or by the passage of a sufficient time period for the self-test to be completed.

In still further embodiments, the DRAM may include a thermal sensor that provides a temperature of the DRAM. Accordingly, the foregoing method embodiments may further comprise monitoring a temperature of the DRAM, and controlling the load on the DRAM during the self-testing in order to prevent the temperature from damaging the module. Optionally, the method may also comprise writing a value into a thermal control register in response to detecting a memory core temperature exceeding a setpoint temperature, and putting the memory core into a power down mode with alternating active and quiet periods determined as a function of the instruction written into the thermal control register. Pre-Charge Power Down control of DRAMS and other related low power modes of DRAMS are known and understood as specified by JEDEC, the international specification body for memory including DRAMs and Modules such as DIMMs. The DRAM of this invention supports these specified modes during BIST and INIT routines of this invention.

Yet another embodiment of the invention provides a method for self-contained testing of the DRAM in a DIMM. The method comprises a plurality of DRAM in the DIMM receiving an instruction from an external processor to start testing a memory core within the DRAM, and each DRAM in the DIMM self-testing the memory core within the DRAM using a BIST pattern stored in a multipurpose register on the DRAM, wherein the plurality of DRAM are self-tested at the same time. Optionally, after testing each DRAM, the method may further comprise initializing each DRAM with an INIT pattern, such as an INIT pattern stored in the multipurpose register on the DRAM. In a further option, each DRAM may receive an instruction from the external processor that identifies one of a plurality of INIT patterns stored in the multipurpose register as the INIT pattern to be used in the self-test. Similarly, the external processor may instruct one or more of the plurality of DRAM to use a first INIT pattern and instruct one or more other of the plurality of DRAM to use a second INIT pattern.

In a still further embodiment, each DRAM may self-test the memory core within the DRAM using a plurality of BIST patterns stored in the multipurpose register on the DRAM. Regardless of the number of BIST patterns used, each DRAM may run a self-test of the memory core within the DRAM without any involvement of the CPU in the performance of the self-test.

In various embodiments, the step of self-testing includes writing the BIST pattern into all locations of the memory core, reading each location of the memory core, and comparing the content read from each location of the memory core with the BIST pattern, wherein a negative comparison indicates a failure has occurred. Optionally, the number of failures detected during each self-test of each DRAM may counted and/or the location and type of failures detected during self-testing are stored. The type of failure may identify each negative comparison as either a "high read low" failure or a "low read high" failure.

In further embodiments where the system includes an external management controller, such as a BMC, the DRAM, in response to a negative comparison, will send a failure alert to the external management controller, and the external management controller, in response to receiving the failure alert, will read status registers in the DRAM containing information about the negative comparison. In a similar embodiment, the DRAM, in response to self-test completion, may send a completion alert to the external management controller, and the external management controller, in response to receiving the completion alert, may read status registers in the DRAM containing information about the self-test. In yet another embodiment, the external management controller may send BIST patterns to each DRAM for storage prior to each DRAM receiving an instruction from an external processor to test a memory core within the DRAM.

Various embodiments of the invention add one or more new functions inside a DRAM. Accordingly, a DRAM of the present invention may include a BIST routine to test the DRAM memory, an INIT routine to initialize memory with known good ECC patterns when more than one DRAM is accessed together such as on a DIMM or a group of DIMMs, and thermal control during the BIST and INIT functions. A DRAM may be self-tested, and preferably also initialized, without CPU or BMC intervention once the process has started. Where a memory module includes a plurality of DRAM, such as in a DIMM, the self-testing of each DRAM may occur independently and simultaneously. By automating BIST and INIT functions within the DRAM, time can be saved and power can be conserved by eliminating an enormous quantity of transfers between these and other components.

FIG. 1 is a schematic diagram of certain components on a computer system 10 including a DRAM 20. The DRAM 20 communicates with a processor 30 through a memory controller 40 and also optionally communicates with an external management controller 50. The DRAM may function alone or in a set of DRAM on a memory module, such as a DIMM. Each DRAM comprises a multipurpose register 22 in selective communication with a memory core 24 through a switch 26, and a controller 28 in communication with the processor 30, the multipurpose register 22 and the memory core 24. Three different groups of signals enter the DRAM 20 and connect to the controller 28, including bidirectional signals referred to as "Data and Strobes" labeled "D", bidirectional signals referred to as "Management" labeled "M", and the input-only signal referred to as "Clock, Command and Address" labeled "A".

Buses D and A will externally connect to the memory controller 40 which is connected separately to or integrated into a processor 30. In some embodiments, some or all of these buses (D, M, A) will also go through buffers on the mother board (not shown) or on another external card. In some embodiments, the DRAM 20 will be placed on a DIMM with other similar or identical DRAMs. The DIMM may also buffer the data received on bus D or register the commands and addresses received on bus A.

Management bus M is optional to certain embodiments, as discussed, and connects to the external management controller 50, such as a Baseboard Management Controller (BMC). The external management controller 50 will be used throughout to represent all classes of management controllers and bus M will represent all classes of management controller buses, such as "single wire", "I2C", "SMB", "PECI", or other narrow buses.

Signal B1 from the controller 28 to the switch 26 will control the operation (i.e., opening and closing) of the switch 26. Signal C1 originates with a thermal sensor 29 in thermal communication with the DRAM memory core 24 and the signal C1 communicates with the controller 28. The inclusion and use of the thermal sensor 29 and the signal C1 is optional to certain embodiments, but when present will signal to the controller 28 that memory core 24 temperatures are elevated. While this signal C1 is asserted, the controller 28 will halt BIST and INIT activities to prevent thermal excursions above specified parameters. The controller 28 also contains a thermal control register whose value when programmed with a first value will select thermal sensor control, or with a second value it will disable thermal control, or with any other value will select a percentage of time to stop BIST and INIT cycles and put the DRAM memory core 24 into the DRAM architected pre-charge power down mode.

The controller 28 contains the logic to support the added BIST, INIT and thermal control functionality of this invention. In some embodiments, the controller 28 will store BIST and INIT patterns and status. The quantity of BIST and INIT patterns stored is not restricted. The determination on how many BIST and INIT patterns to use can be made dynamically. Patterns can even be provided via the external buses before or updated during the BIST and INIT routines in some embodiments.

The Multi-Purpose Register (MPR) 22 supports functions of this invention by allocating registers to support the BIST and INIT routines. Whether stored in the MPR 22 or programmed into the controller 28, the only limit to the number of BIST or INIT patterns and associated failure status registers are how many registers are provided in the devices to store them. All BIST patterns will be used sequentially up to the quantity identified in BIST Patterns Used Register. Only one INIT pattern will be used per DRAM, but not all DRAMS when grouped will use the same pattern. When grouped, an encoded chain of commands from buses D and A, or bus M, can distinguish between which DRAMs are targeted and which INIT patterns to use. For the case where the commands are provided over buses D and A, the distinguishing characteristics can be placed on the D bus. If more registers are available than there are data bits to select them, the commands can be chained to provide sufficient data bits to select each pattern register.

Switch 26 is controlled by the logic in the controller 28. The switch determines whether data from the MPR 22 is allowed onto the data bus D1. In general, MPR data is driven through the switch 26 only when the memory core 24 and the controller 28 are either tri-stated or receiving. Only one component of controller 28, the MPR 22 and the memory core 24 are allowed to drive data on the bus D1 at any given time, and the other two of the three components must either be tri-stated, receiving or disconnected by the switch 26.

The system in FIG. 1 generally describes any of various specific implementations of computer systems consistent with the present invention. Accordingly, various embodiments of the invention may be described with reference to FIG. 1. It should be recognized that the methods of the invention are not limited to the structure shown in FIG. 1, but the reference to FIG. 1 may be helpful in understanding the methods. Furthermore, the invention is described below in terms of four specific embodiments, but these embodiments represent non-limiting examples that are set out of to show the breadth of the invention.

received from a processor or memory controller. The BIST and INIT routine has a known execution time after which the external processor can read the status of the BIST. This embodiment does not include ECC protection, a BMC is not connected, and the Thermal Control register, if any, is programmed to "disabled".

The DRAM is in a standalone environment where it is the only memory device on the data bus. An MPR register is read only and the BIST and INIT patterns are pre-programmed internally into the MPR 22. The MPR 22 includes a BIST Pattern Available Register that indicates there are sixteen BIST Pattern Registers available. Each of the sixteen BIST Pattern Registers stores a BIST pattern to be used in self-testing the DRAM. The MPR 22 also includes four BIST Failure Registers that are available to store failure data for one memory address location, but each BIST Failure Register has sufficient space for storing the failure status for each data bit at that location. These BIST Failure Registers will be used as necessary if failures occur.

The MPR 22 includes one INIT Pattern Register that stores a single INIT pattern for initializing the DRAM. The INIT routine is automatically started following the completion of the BIST routine. Upon completion of both the BIST and INIT routines, a completion flag with associated status is made available for the processor to read from the controller 28 as an encoded message across buses D and A.

The controller 28 knows the size of the memory core and how many different address locations there are and how many data bits are associated with each address. The controller executes commands to the MPR 22 via buses D2 and A2, which may be physical buses between separate devices 28, 22 or logical connections within a common device. The controller 28 may also execute commands to the DRAM memory core 24 directly via buses A1 and D1 with switch 26 open. Data from the DRAM memory core 24 may be read by the controller 28 over buses A1 and D1 with switch 26 open.

After receiving an encoded "start" command from a processor across the buses A and D, the controller 28 sends a

TABLE 1

Summary of Details in Specific, Non-Limiting Embodiments

| Features | Embodiment | | | |
| --- | --- | --- | --- | --- |
| | One | Two | Three | Four |
| DRAM | Standalone | DIMM | Standalone | DIMM |
| MPR | ROM | ROM | ROM | ROM |
| Pattern location | MPR | MPR | MPR | controller |
| Dynamic patterns | No | No | No | Yes |
| BIST Pattern Avail Register | 16 | 16 | 16 | 16 |
| BIST Patterns Used Register | 16 | 16 | 16 | 16 |
| BIST Failure Avail Register | 4 | 4 | 4 | 16 |
| INIT Pattern Avail Register | 1 | 2 | 1 | 4 |
| INIT Pattern Used Register | Yes | Yes | No | Yes |
| Pattern storage type | ROM | ROM | ROM | RAM |
| Perform INIT if BIST fails | Yes | Yes | Yes | No |
| Completion Flag Register | No | No | No | Yes |
| Status Location | controller | controller | controller | controller |
| ECC | No | Yes | No | Yes |
| BMC | No | No | No | Yes |
| Coincident | No | No | Yes | No |
| Thermal Control | No | No | Power Down | Sensor |
| Status | CPU Timed | CPU Timed | CPU Timed | BMC alert |

Embodiment One

A single DRAM includes a self-contained BIST and INIT routine. The only external command needed to completely execute both BIST and INIT routines is a "start" command series of commands to cause all memory locations of the DRAM memory core 24 to be loaded with a first pattern of the sixteen BIST patterns stored in BIST pattern registers of the MPR 22. After loading the first BIST pattern, the controller 28 issues a read command to the MPR 22 via buses A2 and D2 and receives pattern one across bus D3, switch 26 and bus D1. The controller 28 then reads each memory location of the DRAM memory core 24 via buses A1 and D1 and compares the data read with the previously known good pattern. If a failure has occurred (i.e., the data read differs from the pattern), the following status is recorded in an internal register in the controller 28: row address, column address, bank address, data bit=1 if the memory address has failed, and an indicator for each bit that has failed as to whether it was read high when it should have been low, or vice versa. If more than one memory address has data failures, the number of BIST Failure Registers that are available will limit how many of the failures can be stored. If more failures occur than there are registers to store the failing status, then the details of further discovered failures are not stored. However, a counter register will increment with each failure so that the total number of failures will be known. There is a separate counter register for each pattern register. Rank information could also be stored but there is no need as the external agent already has this information.

The above initial sequence (Sequence 1) is repeated with BIST patterns two through sixteen (Sequence 2). If all of the registers storing failing status information are already full, they will not be updated. However, for each BIST pattern the associated BIST Failure Register will record the total number of failures identified on that BIST pass regardless.

After completion the BIST routines, the memory is initialized (Sequence 3). Sequential commands from the controller 28 fill all memory locations of the DRAM memory core 24 with the INIT pattern from MPR 22, even if the BIST reported bad memory locations. A completion flag is not required.

The processor having waited a known length of time reads the first BIST Failure Register (Sequence 4). If the first BIST Failure Register indicates that none of the data bits have failed, then there are no failures to report and the BIST and INIT were successful. If failures are found, the processor will continue reading all remaining BIST Failure Registers until one is found without a failure. If all registers are found to contain a failure, then each of sixteen BIST Failure Counter registers are read.

Embodiment Two

This embodiment differs from Embodiment One, above, in that the DRAM is now on a DIMM and that ECC at the DIMM or multi-DIMM level will be provided using identical DRAMs programmed with the same BIST patterns in the ROM MPR register. This is done by the external processor indicating, via buses A and D, to each individual DRAM of the one or more DIMMS that share the ECC code to use one of the two INIT patterns already in the MPR 22.

Before the DRAM receives the encoded "start" command, the external processor indicates for each DRAM which of two INIT patterns stored in the MPR 22 is to be used. All other Sequence 1 events from Embodiment One are the same for each DRAM.

Events are the same as Sequence 2 from Embodiment One for each DRAM.

The DIMM is initialized somewhat differently than in Sequence 3 from Embodiment One, only in that there are multiple DRAMs, each of which receives one of two INIT patterns, but not all DRAMs receive the same pattern.

The processor waits a known length of time and then reads the first BIST Failure Register(s) as in Sequence 4 of Embodiment One for each DRAM. Multiple external commands will likely be required to sequence through all of the DRAM status.

Embodiment Three

This embodiment differs from Embodiment One in that the INIT Pattern Registers are not used. Rather, the INIT routine is skipped and the last BIST routine pattern is selected to also provide a valid INIT pattern. This can further reduce memory test and initialization time by 20% in the case when only two BIST patterns are required.

In addition, the Thermal Control Register is programmed to assert the known DRAM pre-charge power down mode at the percentage of time determined by the value in the Thermal Control Register. During the BIST and INIT sequences below, the bus will alternately be active then become quiet and the DRAM memory core 24 will be put into power down mode during thermally significant periods of time for an average of time specified in this register.

The BIST routine is performed the same as in Sequence 1 and 2 of Embodiment One. However, the INIT routine is skipped because the last BIST pattern written into the DRAM memory core 24 from Sequence 2 serves as both a BIST pattern and an INIT pattern. Accordingly, the memory is already initialized as a result of Sequence 2. The processor reads the results in the same manner as in Sequence 4 of Embodiment One.

Embodiment Four

In this embodiment, many DRAMs are placed on a DIMM, BIST and INIT patterns are stored into the controller 28, patterns are dynamically loaded from an external BMC on the bus M, and there are sixteen BIST Pattern Registers, sixteen BIST Failure Registers and four INIT Pattern Registers. If the BIST fails, the process will terminate prematurely without memory getting initialized and will signal the BMC to check status. The Thermal Control Register is programmed to receive data from the thermal sensor located in the DRAM memory core 24. While this thermal sensor is active, the controller 28 will stop the BIST and INIT transfers and put the DRAM memory core 24 into pre-charge power down mode. This power down can be repeated as necessary during the below sequences.

Before the "start" command is sent to the DRAM, the external BMC sends BIST and INIT patterns into each DRAM to be stored in the controller 28 with associated registers and values as shown in Table 1 for Embodiment Four. Thereafter, the BIST routine is performed as in sequences 1 and 2 of Embodiment One, except that if there are failures then an alert is sent to the BMC to check status and processing stops.

If there are no failures in sequences 1 and 2, above, then the memory core is initialized. The initialization differs from Sequence 3 of Embodiment One only in that there are multiple DRAMs each of which receives one of four INIT patterns, but not all DRAMs receive the same pattern. Following initialization, an alert is sent to the BMC, which then reads the status registers of the controller 28 to learn that the INIT routine has completed without failures.

Figure 2:
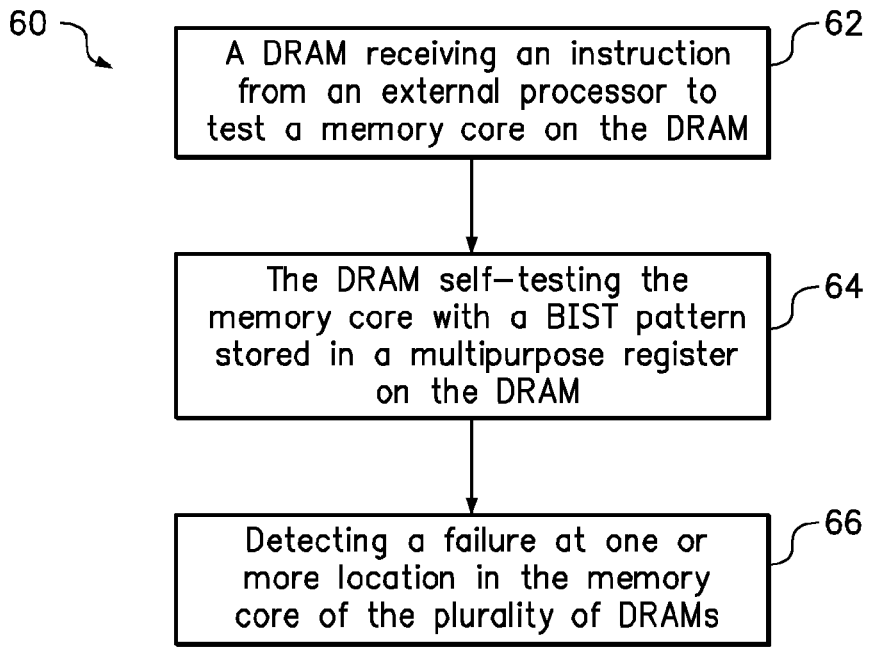
FIG. 2 is a flowchart of one embodiment of a method for self-contained testing with a DRAM.

FIG. 2 is a flowchart of one embodiment of a method 60 for self-contained testing with a DRAM. In step 62, a DRAM receives an instruction from an external processor to test a memory core on the DRAM. In step 64, the DRAM self-tests the memory core with a BIST pattern stored in a multipurpose register on the DRAM. In step 66, the method includes detecting a failure at one or more location in the memory core of the plurality of DRAM.

Figure 3:
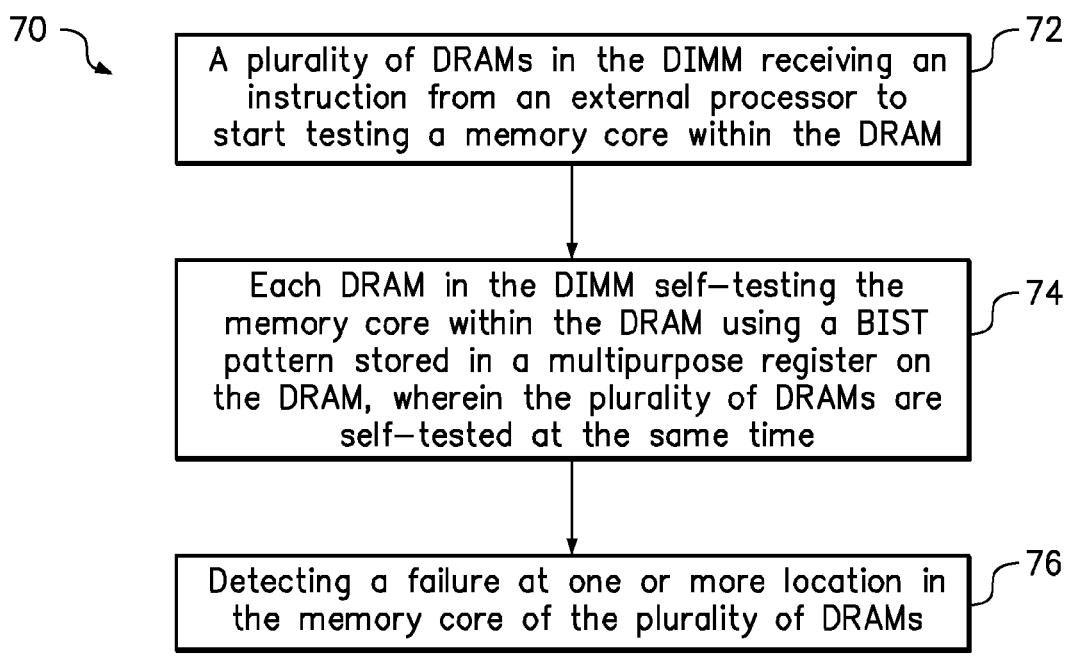
FIG. 3 is a flowchart of one embodiment of a method for self-contained testing of a DIMM

FIG. 3 is a flowchart of one embodiment of a method 70 for self-contained testing of a DIMM. In step 72, the method includes a plurality of DRAMs in the DIMM receiving an instruction from an external processor to start testing a memory core within the DRAM. In step 74, each DRAM in the DIMM self-tests the memory core within the DRAM using a BIST pattern stored in a multipurpose register on the DRAM, wherein the plurality of DRAMs are self-tested at the same time. In step 76, the method includes detecting a failure at one or more location in the memory core of the plurality of DRAM.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for self-contained testing with a DRAM comprising:
    the DRAM receiving an instruction from an external processor to test a memory core on the DRAM;
    the DRAM self-testing the memory core with a BIST pattern stored in a multipurpose register on the DRAM; and
    detecting a failure at one or more location in the memory core of the plurality of DRAM.

2. The method of claim 1, further comprising:
    the DRAM self-testing the memory core with a plurality of BIST patterns stored in the multipurpose register on the DRAM.

3. The method of claim 2, wherein the last BIST pattern includes valid ECC check bits and serves as a valid INIT pattern to initialize the DRAM.

4. The method of claim 1, further comprising:
    counting a number of failures detected during testing.

5. The method of claim 1, further comprising:
    storing the one or more location in the memory core where a failure was detected during testing; and
    storing a type of failure in association with each of the one or more stored locations.

6. The method of claim 1, further comprising:
    after testing the DRAM, initializing the DRAM with an INIT pattern stored in the multipurpose register on the DRAM.

7. The method of claim 6, wherein the INIT pattern is a known good pattern with valid ECC check bits.

8. The method of claim 6, wherein the step of initializing automatically follows completion of the testing.

9. The method of claim 6, further comprising:
    setting a completion flag and a completion status in response to completing the BIST and INIT routines.

10. The method of claim 1, further comprising:
    monitoring a temperature of the dynamic random access memory; and
    controlling a load on the dynamic random access memory during the testing to prevent the temperature from damaging the dynamic random access memory.

11. The method of claim 1, further comprising:
    writing a value into a thermal control register in response to detecting a memory core temperature exceeding a set-point temperature; and
    putting the memory core into a power down mode with alternating active and quiet periods determined as a function of the value written into the thermal control register.

12. The method of claim 1, wherein the step of self-testing includes writing the BIST pattern into all locations of the memory core, reading each location of the memory core, and comparing the content read from each location of the memory core with the BIST pattern, wherein a negative comparison indicates a failure has occurred.

13. The method of claim 12, further comprising:
    identifying each negative comparison as either a "high read low" failure or a "low read high" failure.

14. A method for self-contained testing of a DIMM comprising:
    a plurality of DRAMs in the DIMM receiving an instruction from an external processor to start testing a memory core within the DRAM;
    each DRAM in the DIMM self-testing the memory core within the DRAM using a BIST pattern stored in a multipurpose register on the DRAM, wherein the plurality of DRAMs are self-tested at the same time; and
    detecting a failure at one or more location in the memory core of the plurality of DRAM.

15. The method of claim 14, further comprising:
    after testing each DRAM, initializing each DRAM with an INIT pattern.

16. The method of claim 15, wherein the INIT pattern is stored in the multipurpose register on the DRAM.

17. The method of claim 16, further comprising:
    each DRAM receiving an instruction from the external processor that identifies one of a plurality of INIT patterns stored in the multipurpose register as the INIT pattern to be used in the self-test.

18. The method of claim 17, wherein the external processor instructs one or more of the plurality of DRAMs to use a first INIT pattern and instructs one or more other of the plurality of DRAMs to use a second INIT pattern.

19. The method of claim 14, further comprising:
    each DRAM self-testing the memory core within the DRAM using a plurality of BIST patterns stored in the multipurpose register on the DRAM.

20. The method of claim 14, wherein the step of self-testing includes writing the BIST pattern into all locations of the memory core, reading each location of the memory core, and comparing the content read from each location of the memory core with the BIST pattern, wherein a negative comparison indicates a failure has occurred.

21. The method of claim 20, further comprising:
    counting a number of failures detected during each self-test of each DRAM.

22. The method of claim 20, further comprising:
    storing the one or more location in the memory core where a failure was detected during self-testing; and
    storing a type of failure in association with each of the one or more stored locations.

23. The method of claim 20, further comprising:
    identifying each negative comparison as either a "high read low" failure or a "low read high" failure.

24. The method of claim 20, further comprising:
    the DRAM, in response to a negative comparison, sending a failure alert to an external management controller; and the external management controller, in response to receiving the failure alert, reading status registers in the DRAM containing information about the negative comparison.

25. The method of claim 24, further comprising:

the DRAM, in response to self-test completion, sending a completion alert to the external management controller; and the external management controller, in response to receiving the completion alert, reading status registers in the DRAM containing information about the self-test.

26. The method of claim 14, further comprising:

an external management controller sending the BIST pattern to each DRAM for storage prior to each DRAM receiving an instruction from an external processor to test a memory core within the DRAM.

27. The method of claim 14, wherein each DRAM self-test of the memory core within the DRAM is run without any involvement of a CPU in the performance of the self-test.

28. The method of claim 14, further comprising:

writing a value into a thermal control register in response to detecting a memory core temperature exceeding a set-point temperature; and putting the memory core into a power down mode with alternating active and quiet periods determined as a function of the value written into the thermal control register.

* * * * *